United States Patent
Tanaka

(10) Patent No.: US 11,520,233 B2
(45) Date of Patent: Dec. 6, 2022

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventor: Keiichi Tanaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/008,919

(22) Filed: Sep. 1, 2020

(65) Prior Publication Data

US 2021/0063883 A1    Mar. 4, 2021

(30) Foreign Application Priority Data

Sep. 3, 2019   (JP) .............................. JP2019-160273

(51) Int. Cl.
*G03F 7/20* (2006.01)
(52) U.S. Cl.
CPC .......... *G03F 7/2041* (2013.01); *G03F 7/2002* (2013.01); *G03F 7/70758* (2013.01)
(58) Field of Classification Search
CPC ............. G03F 7/72041; G03F 7/72002; G03F 7/70758; G03F 7/2041; H01L 21/67115; H01L 21/67248

USPC ...................................................... 355/27, 30
See application file for complete search history.

(56) References Cited

U.S. PATENT DOCUMENTS

| | | | | |
|---|---|---|---|---|
| 10,388,543 B2 * | 8/2019 | Tanaka | ............... | H01L 21/68742 |
| 11,064,598 B2 * | 7/2021 | Tanaka | ............... | H01L 21/67248 |
| 2001/0015174 A1 * | 8/2001 | Saki | ................... | H01L 21/02249 |
| | | | | 118/722 |
| 2020/0294799 A1 * | 9/2020 | Saitou | ............... | H01L 21/67115 |

FOREIGN PATENT DOCUMENTS

JP          3342856 B2      8/2002

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A substrate processing apparatus includes a holder configured to hold, within a processing container, a substrate having a pattern formed of a resist material for EUV lithography on a surface thereof, a rotation driving part configured to rotate the holder, and a light source part including a plurality of light sources configured to emit light to the surface of the substrate held by the holder rotated by the rotation driving part such that a number of rotations of the substrate is 0.5 rpm to 3 rpm.

11 Claims, 13 Drawing Sheets

SUBSTRATE PROCESSING APPARATUS, SUBSTRATE PROCESSING METHOD, AND STORAGE MEDIUM

CROSS-REFERENCE TO RELATED APPLICATION

This application is based upon and claims the benefit of priority from Japanese Patent Application No. 2019-160273, filed on Sep. 3, 2019, the entire contents of which are incorporated herein by reference.

TECHNICAL FIELD

Embodiments disclosed herein relate to a substrate processing apparatus, a substrate processing method, and a storage medium.

BACKGROUND

Patent Document 1 discloses a process for manufacturing a semiconductor device, in which a step of emitting light having a wavelength of 200 nm or less to the front surface of a resist formed on the surface of a substrate and patterned after exposure, and a step of etching an underlying film of the resist film are sequentially performed. The step of emitting light having a wavelength of 200 nm or less (hereinafter, simply referred to as a "light emission step") is performed for the purpose of improving roughness (irregularity) of, for example, the resist film.

PRIOR ART DOCUMENT

[Patent Document]
Japanese Patent No. 3342856

SUMMARY

According to embodiments of the present disclosure, there is provided a substrate processing apparatus including: a holder configured to hold, within a processing container, a substrate having a pattern formed of a resist material for EUV lithography on a surface of the substrate; a rotation driving part configured to rotate the holder; and a light source part including a plurality of light sources configured to emit light to the surface of the substrate held by the holder that is rotated by the rotation driving part such that a number of rotations of the substrate is 0.5 rpm to 3 rpm.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
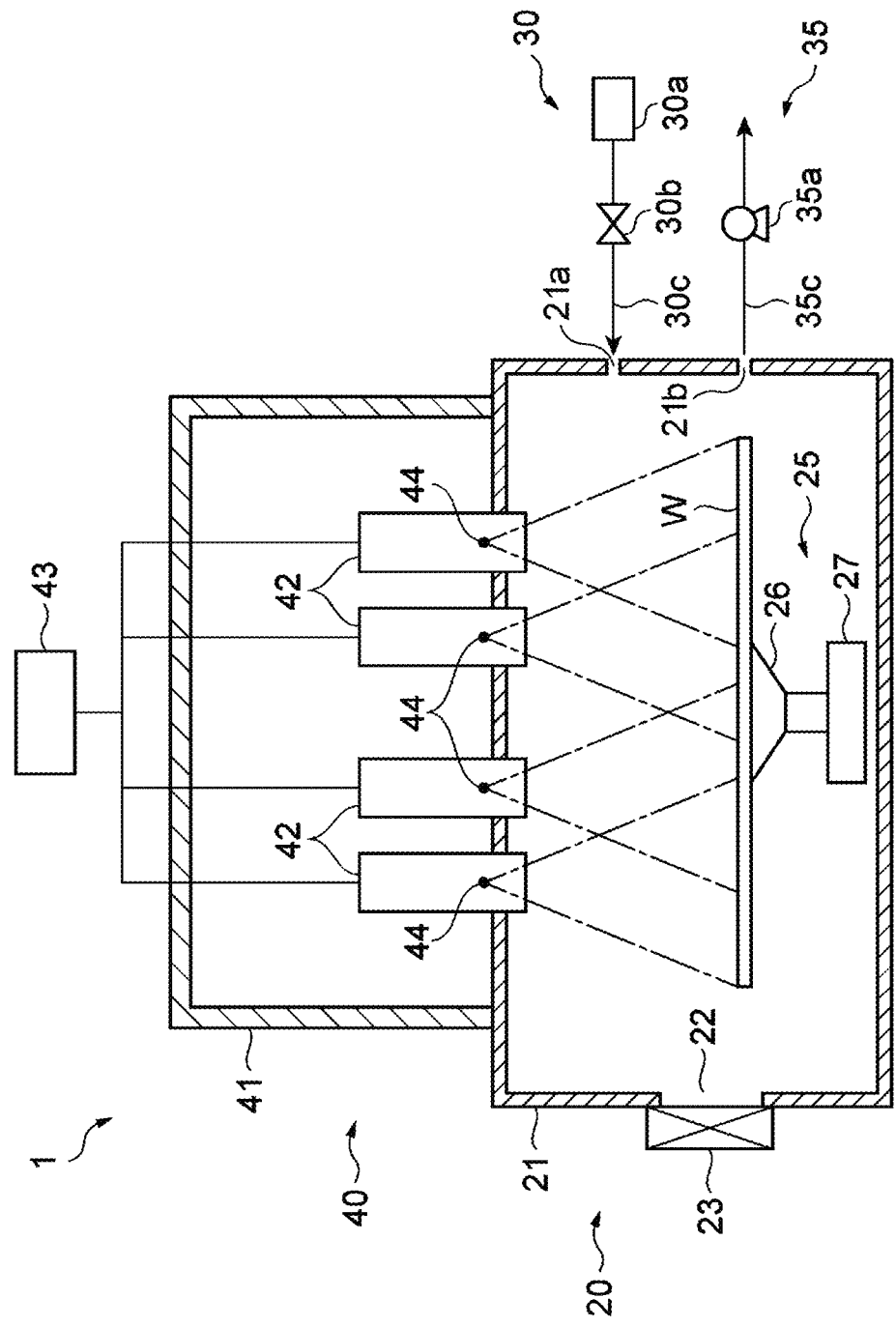
FIG. 1 is a view illustrating a substrate processing apparatus according to an exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Hereinafter, various exemplary embodiments will be described.

In an exemplary embodiment, a substrate processing apparatus includes: a holder configured to hold, in a processing container, a substrate having a pattern formed of a resist material for EUV lithography on a surface thereof; a rotation driving part configured to rotate the holder; and a light source part including a plurality of light sources configured to emit light including vacuum ultraviolet light to the surface of the substrate held by the holder rotated by the rotation driving part. The number of rotations of the substrate is 0.5 rpm to 3 rpm.

With regard to a substrate having a pattern formed of a resist material for EUV lithography on the surface thereof, it may be considered that penetration of light, particularly light having a low wavelength, becomes insufficient when the vacuum ultraviolet light is emitted to the pattern. In contrast, in the substrate processing apparatus described above, by setting the number of rotations within the above-mentioned range, it is easy for even the light having the low wavelength to penetrate into the pattern. Thus, it is possible to enhance the effect of improving surface roughness.

Here, a configuration in which the number of rotations of the substrate is changed while the light source part emits light may be adopted.

A component of light that penetrates into the pattern may be changed depending on the number of rotations of the substrate during the emission of light. Therefore, by adopting the configuration in which light is emitted while changing the number of rotations, it is possible to cause a light component suitable for improving surface roughness to penetrate into the pattern. Thus, it is possible to further enhance the effect of improving surface roughness.

A configuration in which the rotation of the substrate is temporarily stopped while the light source part emits light may be adopted.

With the configuration of stopping the rotation as described above, it is possible to adjust, for example, the amount of light emitted to the pattern. Accordingly, it is possible to cause a light component suitable for improving surface roughness to penetrate into the pattern, and thus to further enhance the effect of improving surface roughness.

A configuration in which a gas supply part configured to supply an inert gas into the processing container and a gas discharge part configured to discharge the gas from the inside of the processing container are provided may be adopted. In this case, the gas supply part and the gas discharge part may perform the supply and discharge of the gas while the pressure inside the processing container is changed during the light emission performed by the light source part.

With the configuration in which the supply and discharge of the gas are performed while the pressure inside the processing container changes during the light emission performed by the light source part as described above, it is possible to emit vacuum ultraviolet light to the pattern while keeping the pressure in the processing container in a state according to the surface condition of the substrate.

In an exemplary embodiment, a substrate processing method includes: emitting light including vacuum ultraviolet light from a light source part including a plurality of light sources to a surface of a substrate on which a pattern is formed of a resist material for EUV lithography in a processing container while rotating the substrate such that the number of rotations of the substrate is 0.5 rpm to 3 rpm. With the substrate processing method described above, by setting the number of rotations within the above-mentioned range, it is also easy for light having the low wavelength to penetrate into the pattern. Thus, it is possible to enhance the effect of improving surface roughness.

In another exemplary embodiment, the storage medium is a non-transitory computer-readable storage medium that stores a program for causing an apparatus to execute the substrate processing method described above.

Hereinafter, various exemplary embodiments will be described in detail with reference to the drawings. In each of the drawings, the same or corresponding parts will be denoted by the same reference numerals.

[Configuration of Substrate Processing Apparatus]

FIG. 1 is a schematic view (vertical cross-sectional view) illustrating a substrate processing apparatus according to an embodiment. The substrate processing apparatus 1 emits processing light to a wafer (substrate) W. For example, the substrate processing apparatus 1 is configured to emit vacuum ultraviolet light (VUV light) to a resist film or a resist pattern formed on the surface of a wafer W so as to improve the surface roughness of the resist material thereof.

The wafer W has a disk shape, but a portion of a circle may be cut out. Alternatively, a wafer having a shape other than a circle such as a polygon may be used. The wafer W may be, for example, a semiconductor substrate, a glass substrate, a mask substrate, a flat panel display (FPD) substrate, or other various substrates.

Figure 2A:
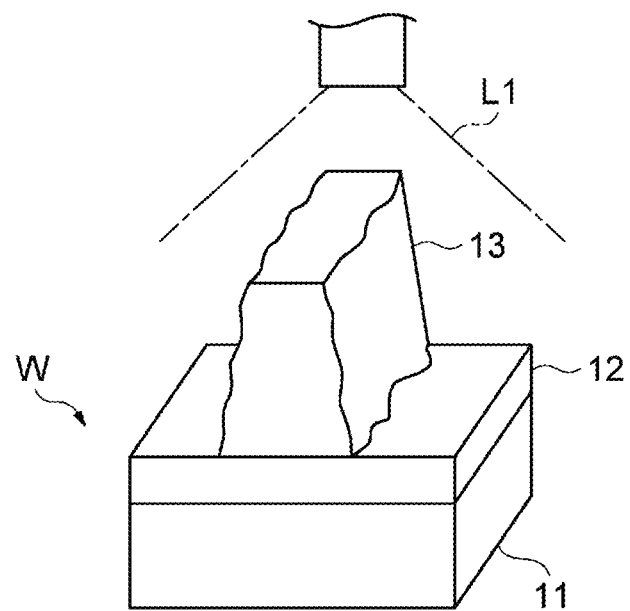
FIGS. 2A and 2B are schematic views illustrating substrate processing using a substrate processing apparatus.
Figure 2B:
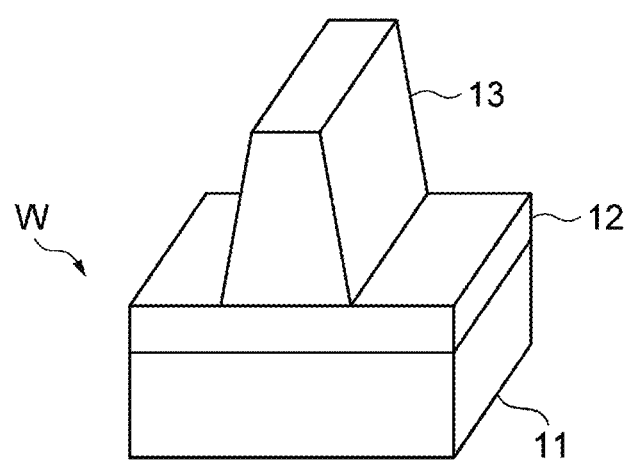

FIGS. 2A and 2B illustrate an exemplary process performed on a wafer W using the substrate processing apparatus 1. As illustrated in FIG. 2A, in a wafer W, a resist pattern 13 is formed on underlying films, that is, a silicon-on-carbon (SOC) film 11 and a silicon-on-glass (SOG) film 12 on the SOC film 11. In the substrate processing apparatus 1, by emitting processing light L1 to the surface of the wafer W, the surface roughness of the resist pattern 13 is improved as illustrated in FIG. 2B. The resist pattern 13 is a mask pattern for etching the underlying films, that is, the SOC film 11 and the SOG film 12, so as to form a pattern on the underlying films.

Returning back to FIG. 1, each part of the substrate processing apparatus 1 will be described. As illustrated in FIG. 1, the substrate processing apparatus 1 includes a processing chamber 20, a light emission mechanism (light source part) 40, and a controller (control part) 100. FIG. 1 illustrates only a portion of the configuration included in the light emission mechanism 40.

The processing chamber 20 includes a housing (processing container) 21, a transport port 22, a rotary support part 25, a gas supply part 30, and a gas discharge part 35. The housing 21 is, for example, a portion of a vacuum container provided in an air atmosphere, and is configured to be able to accommodate a wafer W transported by a transport mechanism (not illustrated). That is, the housing 21 functions as a processing container for processing the wafer W therein. In the substrate processing apparatus 1, the wafer W is processed while the wafer W is accommodated in the housing 21. A transport port 22 is formed in the side wall of the housing 21. The transport port 22 is an opening for loading/unloading a wafer W into/from the housing 21. The transport port 22 is opened and closed by a gate valve 23.

The rotary support part 25 has a function of holding a wafer W while rotating the wafer in the housing 21 based on an instruction from the controller 100. The rotary support part 25 includes a holder 26 and a rotation driving part 27. The holder 26 supports the central portion of a wafer W horizontally disposed in the state in which the surface on which the resist pattern 13 is formed faces upward, and holds the wafer W by, for example, vacuum suction. The rotation driving part 27 has a function of rotating the holder 26 holding the wafer W together with the wafer W around a vertical axis A1. The rotation driving part 27 is, for example, a rotation actuator that uses an electric motor as a power source.

The gas supply part 30 is configured to supply an inert gas (e.g., argon or nitrogen) into the housing 21 through a through hole 21a formed in the housing 21. The gas supply part 30 has a gas source 30a, a valve 30b, and a pipe 30c. The gas source 30a stores the inert gas, and functions as an inert gas supply source. The valve 30b operates based on an operation signal from the controller 100 so as to open and close the pipe 30c. The pipe 30c connects the gas source 30a, the valve 30b, and the through hole 21a sequentially from the upstream side.

The gas discharge part 35 discharges gas from the housing 21 through the through hole 21b formed in the housing 21. The gas discharge part 35 has a vacuum pump 35a and a pipe 35c. The vacuum pump 35a discharges gas from the inside of the housing 21. The pipe 35c connects the through hole 21b and the vacuum pump 35a to each other.

Figure 3:
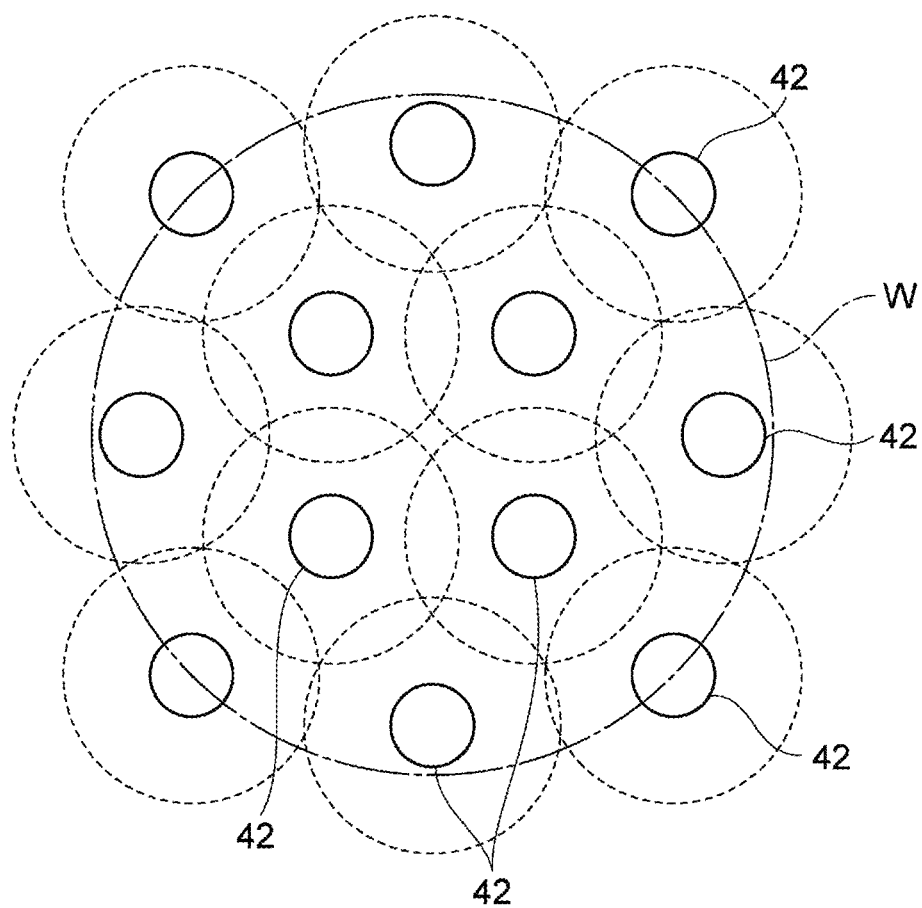
FIG. 3 is a schematic view illustrating an arrangement of light sources in a substrate processing apparatus.

The light emission mechanism 40 includes a housing 41, a light source 42, and a switch 43. The housing 41 is provided above the housing 21. A plurality of light sources 42 are housed in the housing 41. FIG. 3 is a plan view showing an exemplary arrangement of light sources 42. The light sources 42 are arranged along two concentric circles centering on an axis A1 that is the rotation axis of the holder 26 in a plan view. Specifically, four light sources 42 and eight light sources 42 are arranged along the inner circle and the outer circle, respectively, at intervals in the circumferential direction. The light sources 42 arranged in this way emit light to the entire surface of the wafer W held by the holder 26. The switch 43 switches ON/OFF of lighting of the light sources 42. The operation of the switch 43 is controlled by the controller 100. The exemplary arrangement of the light sources 42 is an example, and may be appropriately changed.

The light sources 42 emit light having a wavelength of 115 nm to 400 nm, that is, light forming a continuous spectrum of 115 nm to 400 nm. The light forming a continuous spectrum in this range may include light having a wavelength of 10 nm to 200 nm (that is, VUV light) and may also include near-ultraviolet light (near-ultraviolet rays) having a wavelength larger than that of VUV light. The light from the light sources 42 may be configured to include light in the wavelength band of 160 nm or less. The light sources 42 are, for example, deuterium lamps, and may be configured to emit VUV light having a wavelength of 200 nm or less. The wavelength of the peak of the continuous spectrum may be, for example, 160 nm or less, or 150 nm or more.

Since the wavelength region of the spectrum of the light emitted from the light sources 42 is relatively wide, the resist pattern 13 on the wafer W receives energy of light of various wavelengths. As a result, various reactions occur on the surface of the resist pattern 13. Specifically, since chemical bonds are broken at various positions in the molecules forming the resist pattern 13 to generate various compounds, the orientation of the molecules existing in the resist film before light emission is broken up. As a result, the surface free energy in the resist pattern 13 is reduced, and the internal stress is reduced. That is, by using the light sources 42 as the light source, the fluidity of the surface of the resist pattern 13 tends to be high, and as a result, the effect of improving the surface roughness can be enhanced.

In the resist pattern 13, a crosslinking reaction also occurs during and after emission of light (especially, VUV light) from the light sources 42. Since the crosslinking reaction occurs simultaneously in the resist pattern 13, the surface of the resist pattern 13 is hardened, and as a result, etching resistance becomes high. Accordingly, when the underlying films are etched using the resist pattern 13 as a mask, it is possible to improve the roughness of the pattern surface in the underlying films.

Among the light emitted from the light sources 42, a light component having a wavelength shorter than 160 nm is considered to greatly contribute to the improvement of the roughness of surfaces of the resist pattern 13 and the pattern surface in the underlying films. For example, it has been confirmed that when only light having a wavelength longer than 160 nm is emitted to the resist pattern, only the breaking of chemical bonds proceeds without sufficiently improving the roughness of the surface. However, even when only light having a wavelength shorter than 160 nm is emitted, the surface roughness is not sufficiently improved. Therefore, it is considered that light forming a continuous spectrum including both light having a wavelength longer than 160 nm and light having a wavelength shorter than 160 nm, such as in a deuterium lamp, is important for improving the surface roughness.

Regarding the light emitted to the resist pattern 13 from the light sources 42, the light having a longer wavelength can reach the deep layer of the resist pattern 13 when the intensity thereof is larger. However, since the peak wavelength of the spectrum of the light emitted from the light sources 42 is included in the VUV light band (10 nm to 200 nm) as described above, the intensity of the light emitted from the light sources 42 and having a relatively long wavelength is small. Accordingly, a small amount of the light emitted from the light sources 42 reaches the deep layer of the resist film, and in the deep layer of the resist film, it is possible to suppress the breaking of the above-mentioned bonds of molecules. That is, by using the light sources 42, it is possible to limit the region of the resist pattern 13 that reacts by light emission, to the surface.

Even with respect to the light in the band of VUV light, the reach depth in the resist pattern changes depending on the wavelength. That is, as described above, a component having a longer wavelength than the light having a wavelength near 150 nm to 160 nm in which the light intensity becomes maximal can reach the deep layer (e.g., 150 nm or more) of the resist pattern 13. On the other hand, a component having a wavelength smaller than 150 nm reaches only the vicinity of the surface of the resist pattern 13 (e.g., 50 nm or less). The intensity of the component having a wavelength smaller than 150 nm is smaller than that of the peak wavelength band in VUV light. That is, the component of the light having a wavelength shorter than 160 nm, which contributes to the improvement of the roughness of the surface, reaches only the vicinity of the surface of the resist pattern 13 (does not reach the deep layer), and facilitates hardening of the surface of the resist pattern 13 due to a crosslinking reaction in the vicinity of the surface. As described above, the component of light having a wavelength shorter than 160 nm is considered to be important for facilitating a crosslinking reaction in the vicinity of the surface of the resist pattern 13. As described above, the light having a wavelength shorter than 160 nm has a great influence on the resist pattern 13, and the dissociation of, for example, side chains of the components contained in the resist pattern 13, decrease in internal stress, and a crosslinking reaction are facilitated. On the other hand, when improving the film quality of the entire resist pattern 13, light having a wavelength longer than 160 nm is also required. Thus, by emitting these lights with an appropriate balance, it is possible to improve the film quality.

The light sources 42 generate top-hat type light, the intensity distribution of which is flat compared to light of Gaussian distribution. Even with top-hat type light, the intensity distribution is not completely flat. That is, spreadable light emitted from each point light source 44 (see FIG. 1) in the light sources 42, specifically, vacuum ultraviolet light having a conical optical path with the point light source 44 as an apex is emitted toward the wafer W. In this way, the light emitted from each light sources 42 has a circular irradiation range on the irradiated surface. In FIG. 3, an expected propagation range of light output from each light source 42 on the surface of the wafer W is indicated by a broken line.

Since VUV light reacts with oxygen in an atmosphere containing oxygen, the effect of improving the roughness of the resist pattern 13 decreases. Therefore, as described later, a vacuum atmosphere is formed in the housing 21 in order to remove oxygen in the housing 21 during the processing of the wafer W. Here, as described above, molecules generated by breaking the bonds by light emission as described above and having a relatively small molecular weight are easily released into this vacuum atmosphere as gas. However, as described above, in the deep layer of the resist film, since the bonds are unlikely to be broken, the release of gas from this deep layer is suppressed. Accordingly, it is possible to suppress the resist pattern 13 from undergoing a general change in shape such as a change in height or a change in width.

Figure 4:
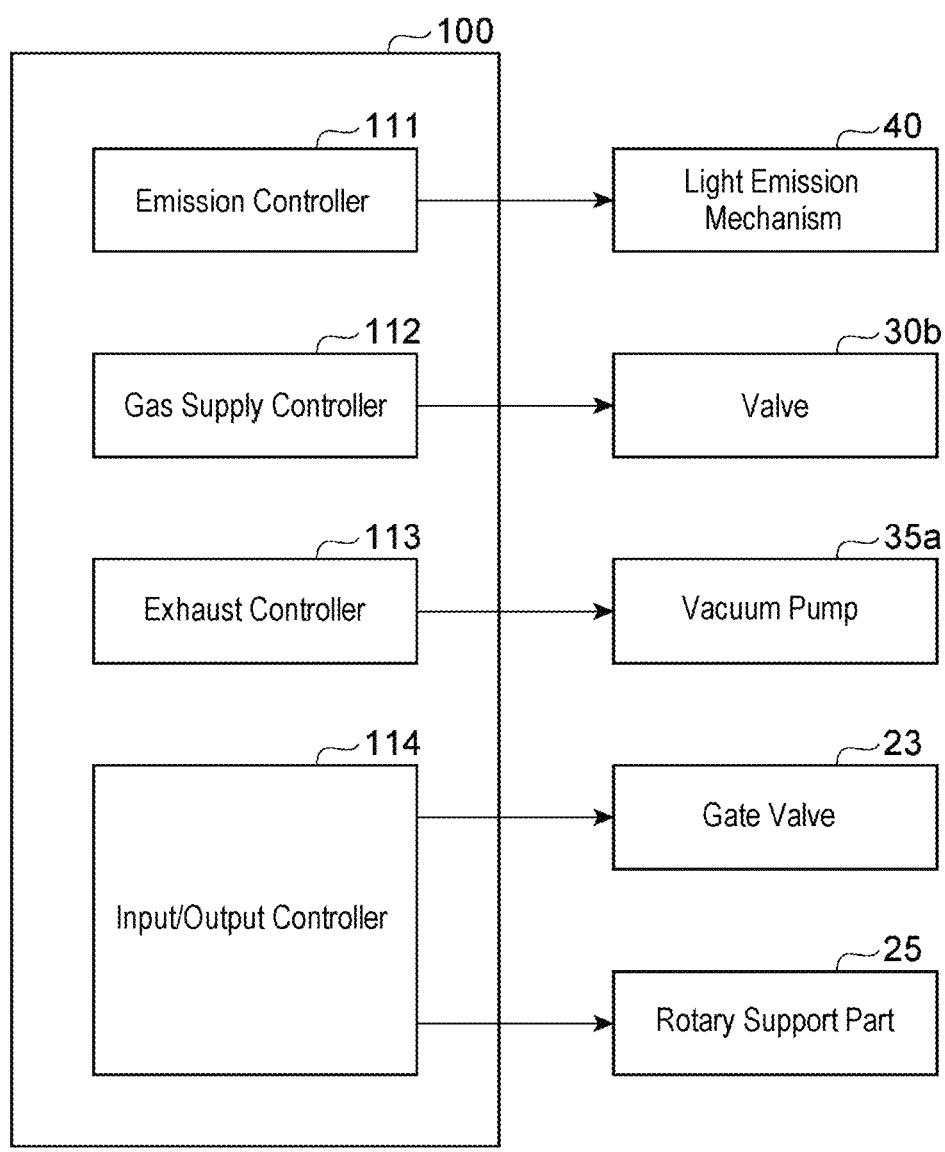
FIG. 4 is a block diagram illustrating a functional configuration of a controller.

Returning back to FIG. 1, the controller 100 of the substrate processing apparatus 1 controls the rotary support part 25, the gas supply part 30, the gas discharge part 35, and the light emission mechanism 40. As illustrated in FIG. 4, the controller 100 has, as functional components (hereinafter, referred to as "functional modules"), an emission controller 111, a gas supply controller 112, an exhaust controller 113, and an input/output controller 114. These functional modules merely mean division of the functions of the controller 100 into a plurality of modules for convenience, and this does not necessarily mean that the hardware constituting the controller 100 is divided into such modules.

The emission controller 111 controls the light emission mechanism 40 to emit VUV light at a desired timing. For example, the emission controller 111 controls the light emission mechanism 40 to turn on all the light sources 42 prior to the emission timing. In addition, the emission controller 111 controls the light emission mechanism 40 to turn off all the light sources 42 after the emission timing is completed.

In addition, the gas supply controller 112 controls the valve 30*b* so as to supply an inert gas from the through hole 21*a* into the housing 21. The exhaust controller 113 controls the vacuum pump 35*a* so as to exhaust the gas in the housing 21 to the outside through the through hole 21*b*.

The input/output controller 115 controls the gate valve 23 to open/close the transport port 22 depending on the loading of a wafer W into the housing 21 or the unloading of a wafer W from the housing 21, and controls the rotary support part 25 to switch between holding and releasing of the wafer W by the holder 26.

Figure 5:
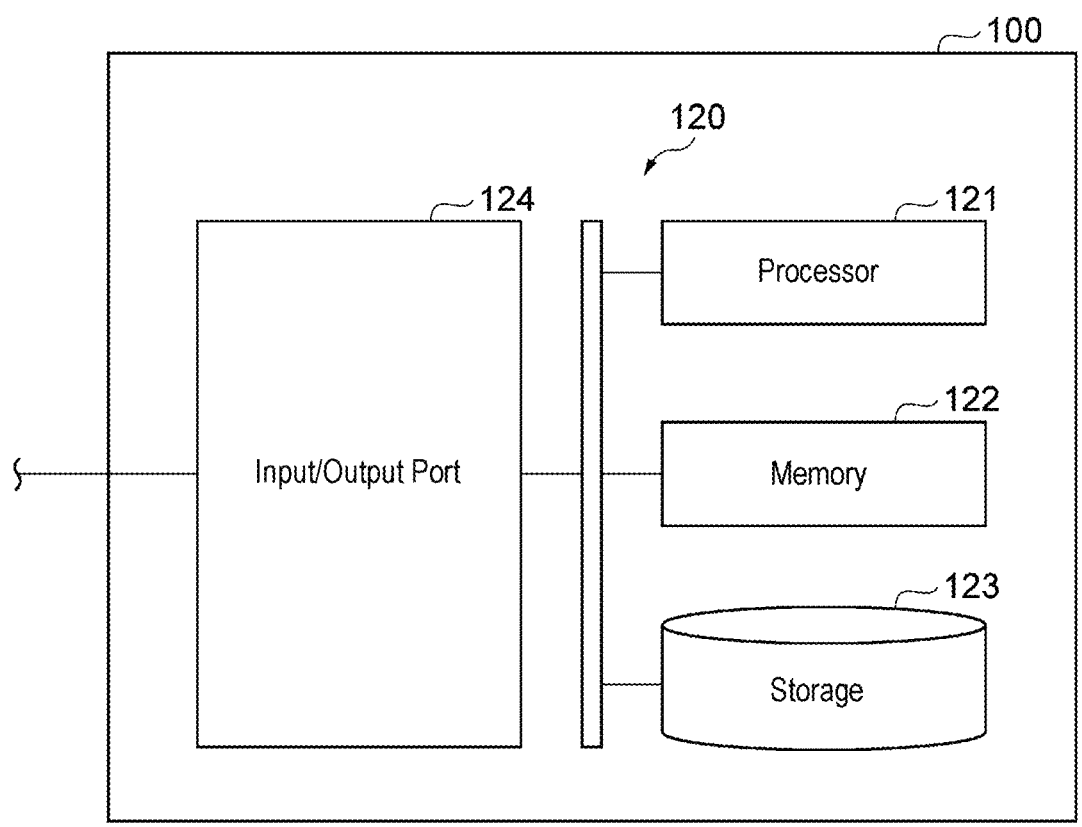
FIG. 5 is a block diagram illustrating a hardware configuration of a controller.

The controller 100 is configured with one or more control computers. For example, the controller 100 includes a circuit 120 illustrated in FIG. 5. The circuit 120 includes one or more processors 121, a memory 122, a storage 123, and an input/output port 124. The storage 123 has a computer-readable storage medium such as a hard disc. The storage medium stores a program for causing the substrate processing apparatus 1 to execute a substrate processing procedure described later. The storage medium may be a removable medium such as nonvolatile semiconductor memory, a magnetic disc, or an optical disc. The memory 122 temporarily stores a program loaded from the storage medium of the storage 123 and a result of arithmetic operation performed by the processor 121. The processor 121 constitutes each of the above-described functional modules by executing the program in cooperation with the memory 122. The input/output port 124 inputs and outputs an electric signal between respective parts controlled by the controller 100 in response to a command from the processor 121.

The hardware configuration of the controller 100 is not necessarily limited to constituting each functional module by a program. For example, each functional module of the controller 100 may be constituted by a dedicated logic circuit or an application specific integrated circuit (ASIC) in which the dedicated logic circuit is integrated.

[Substrate processing Method]

Figure 6:
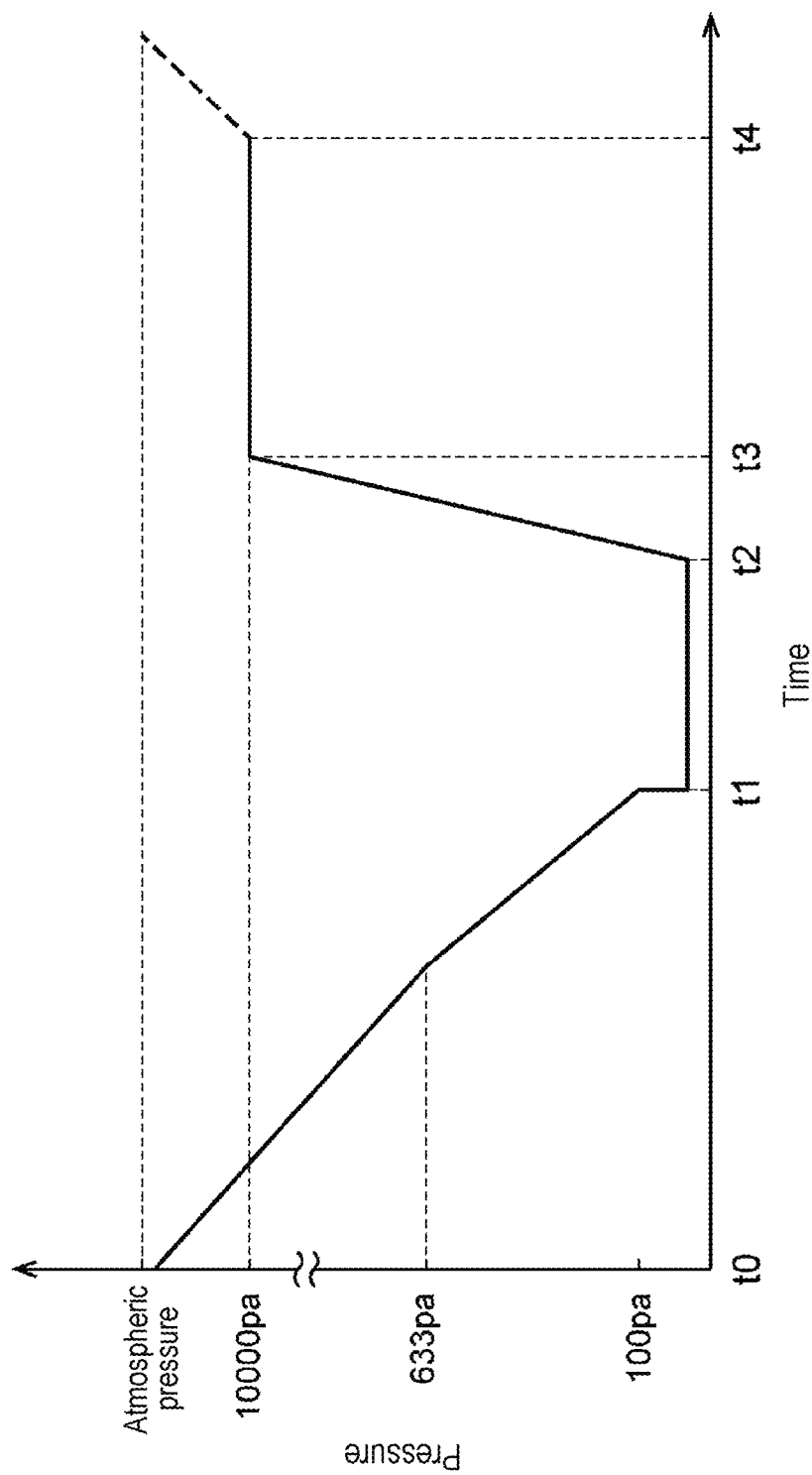
FIG. 6 is a view illustrating changes in pressure during substrate processing in a substrate processing apparatus.
Figure 7:
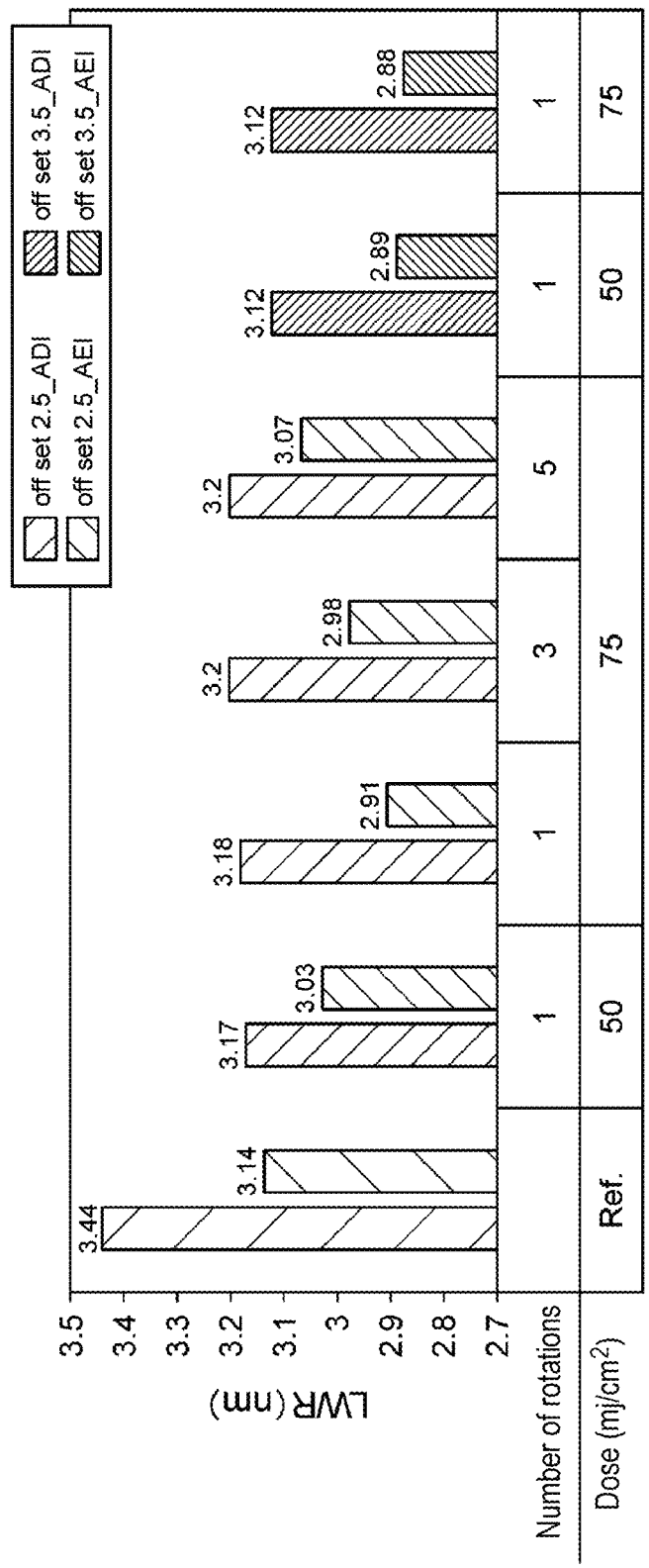
FIG. 7 is a view illustrating a result of Evaluation Test 1.

Next, the operation of the substrate processing apparatus 1 (substrate processing method) will be described with reference to FIGS. 1 and 6. FIG. 6 is a graph showing an outline of changes in pressure inside the housing 21 with time. The horizontal axis of the graph of FIG. 7 represents the elapsed time during the processing, and the vertical axis represents the pressure (unit: Pa) inside the housing 21, which is the processing container, wherein the vertical axis is a schematic logarithmic axis. First, a wafer W is loaded into the housing 21 by a transport mechanism in the state in which the operations of the gas supply part 30 and the gas discharge part 35 are stopped. When the wafer W is placed on the holder 26 of the rotary support part 25, the gate valve 23 is closed and the inside of the housing 21 is made to be airtight. At this time, the inside of the housing 21 is set to, for example, an atmospheric atmosphere of standard pressure (time t0 in FIG. 7). Thereafter, the pressure in the housing 21 is lowered by the operation of the gas discharge part 35.

When the pressure reduction progresses and the pressure in the housing 21 reaches 1 Pa (time t1), the pressure is maintained for a predetermined time. After the pressure reduction state of 1 Pa is maintained for a while (time t2), the valve 30*b* of the gas supply part 30 is opened and Ar gas is supplied into the housing 21. As a result, an Ar gas atmosphere is formed in the housing 21, and the pressure in the housing 21 rises. The pressure reduction rate and the pressure increase rate may be controlled by the operations of the gas supply part 30 and the gas discharge part 35. In addition, the pressure reduction rate and the pressure increase rate may be constant or may be changed midway.

When the pressure inside the housing 21 reaches, for example, 10000 Pa by Ar gas, light including VUV light is emitted to the wafer W from the light sources 42 in the state in which the pressure is maintained inside the housing 21 (time t3). When the light sources 42 emit light for a predetermined time, for example, 30 sec, the light emission is stopped (time t4). Thereafter, the operations of the gas supply part 30 and the gas discharge part 35 are stopped, the pressure in the housing 21 is returned to the atmospheric atmosphere, and then the wafer W is unloaded from the housing 21. Thus, the processing of the wafer W by the substrate processing apparatus 1 is terminated.

As described above, in the substrate processing apparatus 1, the gas supply part 30 supplies the gas and the gas discharge part 35 discharges the gas even when the light sources 42 emit light to the wafer W. Accordingly, it can be said that the Ar gas is replaced while the pressure inside the housing 21 is maintained.

During the light emission from the light sources 42 (between time t3 and time t4), the pressure inside the housing 21 may be constant or may be gradually changed. In the example illustrated in FIG. 6, the pressure inside the housing 21 is set to 10000 Pa during the light emission from the light sources 42 in order to suppress gas release (outgas) from the surface of the wafer W. However, it is conceivable that the amount of released gas gradually decreases while the light is being emitted from the light sources 42. In this case, control may be performed to gradually decrease the pressure inside the housing 21. With such a configuration, it is possible to emit light to the wafer W in a state closer to a vacuum.

[Regarding Substrate Processing for Resist Material for EUV Lithography]

Here, in the substrate processing apparatus 1 according to this embodiment, the following has been found when the resist material used for a resist pattern 13 is a material suitable for EUV lithography using an EUV laser as an exposure light source. That is, it has been found that by emitting light including VUV light under a predetermined condition, the surface roughness of the resist pattern 13 is improved, and the surface roughness of the pattern obtained by etching using the resist pattern 13 as a mask is also improved. The EUV (extreme ultraviolet) laser is a laser having a wavelength of 13.5 nm. In the following embodiments, improvement of surface roughness when the resist material is a material used for EUV lithography will be described.

EUV lithography requires higher resolution, less surface roughness, and higher sensitivity. It is considered that a resist material for EUV lithography can meet such requirements. In the following embodiments, the case in which a general resist material for EUV lithography is used will be described. The resist material may contain, for example, an additive such as an acid generator, a solvent, or a decomposed product.

As described above, by emitting light including VUV light in the substrate processing apparatus 1, in a wafer W, chemical bonds at various positions in molecules forming a resist pattern 13 are broken to generate various compounds. At this time, it is considered that since the chemical bonds are broken at various positions, the surface of the resist pattern 13 becomes less rough. Further, the surface of the resist pattern 13 is hardened by the crosslinking reaction which occurs during and after the emission of the light including the VUV light, and as a result, the etching resistance becomes high. That is, the emission of the VUV light causes the chemical bonds in the resist pattern 13 to be broken and the crosslinking reaction to appropriately proceed. By the breaking of chemical bonds and the crosslinking reaction, it is possible to improve the roughness of the surface of the resist pattern 13 and the surface of an underlying film etched using the resist pattern 13 as a mask.

However, when either of the breaking of chemical bonds or the cross-linking reaction in the resist pattern 13 is insufficient or excessive, the effect of improving the surface roughness is lowered. In other words, by appropriately adjusting the degree of emission of the light including the VUV light in the substrate processing apparatus 1, it is possible to enhance the effect of improving the surface roughness. Regarding this point, verified results will be described below. In particular, a resin material used in a resist for EUV lithography has low responsiveness to the light from the light sources 42 including VUV light, and thus the characteristics thereof are controlled by various additives. Therefore, the effect of improving the surface roughness changes depending on how the additives contained in the resist material react with the light from the light sources 42. This point will also be described.

Factors for changing light emission conditions in the case in which VUV light is emitted to a resist pattern 13 in the substrate processing apparatus 1 may include, for example, "dose (integrated emission amount)", "Ar flow rate during light emission", "number of rotations of wafer during light emission", and "current correction value (offset) of light source". Of these, the "dose" corresponds to the total amount of energy of the light (VUV light) emitted from the light sources 42 with respect to the resist pattern 13. Further, the "Ar flow rate of during emission" and the "current correction value of light source" are related to the transmittance of the light emitted from the light sources 42. That is, these factors affect how much the VUV light reaches the resist pattern 13. The "number of rotations of wafer" affects to what extent the VUV light emitted from the light source 42 generates a modifying effect on the resist pattern 13. The results of evaluation performed while changing the conditions related to the above-mentioned factors will be described below.

(Regarding Ar Flow Rate and Lamp Correction Value)

Both of the "Ar flow rate" and the "lamp correction value" are values related to the transmittance of the light emitted from the light sources 42 when the substrate processing apparatus 1 emits the light from the light sources 42 so as to modify the resist pattern 13. For example, the "Ar flow rate" is the flow rate of Ar supplied into the housing 21 while the inside of the housing 21 is maintained at a predetermined pressure during light emission. When the flow rate of Ar increases, the amount of gas discharged from the housing 21 to the outside also increases. Thus, the discharge of impurities (e.g., sublimates) generated in the housing 21 to the outside is also facilitated. In contrast, when the flow rate of Ar decreases, impurities generated in the housing 21 tend to stay in the housing 21. Therefore, some of the light emitted from the light sources 42 are absorbed or diffused by, for example, the impurities. As a result, the spectrum of the light emitted to the wafer W may change with respect to the light from the light source 42. As described above, the "Ar flow rate" is a factor that may affect the transmittance and wavelength characteristics of the light emitted from the light source 42.

The "lamp correction value" is a value related to the intensity of light emitted from the light sources 42, and when the correction value increases, the intensity of the light emitted from the light sources 42 increases and the amount of light reaching the resist pattern 13 also increases. As described above, the amount of light reaching the resist pattern 13 increases in both the case where the "Ar flow rate" increases and the case where the "lamp correction value" increases. Therefore, compared with the case where the "Ar flow rate" decreases or the case where the "lamp correction value" decreases, the reaction in the resist pattern 13 can be facilitated.

In the case of a resist material for EUV lithography, which will be described in detail later, it is considered that the resist material for EUV lithography is less likely to absorb the light including VUV light emitted from the light sources 42 compared to a resist material used for other purposes, and thus the resist material for EUV lithography is poor in responsiveness to the light from the light sources 42. Therefore, it is considered that sufficient emission of the light from the light sources 42 is effective for modifying the resist pattern 13. Accordingly, it is considered that the resist pattern 13 can be modified more appropriately by increasing the "Ar flow rate" to increase the light transmittance and increasing the "lamp correction value" to increase the amount of light, compared with the case in which the resist material used for other purposes is modified.

(Regarding Improvement of Surface Roughness)
(Evaluation Test 1)

As Evaluation Test 1, a change in LWR (line width roughness) was evaluated when the "number of rotations of wafer" was changed to three conditions and when the "lamp current correction value" during light emission from the light sources 42 was changed to two conditions. LWR is an index of pattern roughness, and the lower LWR value, the smaller the surface roughness of the pattern. The evaluation targets are a resist pattern 13 and a pattern in an underlying film when the underlying film was etched using the resist pattern 13 as a mask.

Wafers W each having a resist pattern 13 formed on an SOC film 11 and an SOG film 12 were prepared as evaluation targets. The pattern width in each wafer W was 20 nm. The resist pattern 13 is composed of polymethylmethacrylate resin (PMMA) and PHS as resin materials, and in addition to PAG and a quencher, a photolytic quencher is further added as an additive in order to improve, for example, roughness.

The wafer W having the resist pattern 13 formed on the surface thereof was stored in the housing 21 of the substrate processing apparatus 1, and the pressure inside the housing 21 was reduced. When the inside of the housing 21 reached the set pressure, light was emitted from the light sources 42. A series of operations is the same as the above substrate processing method. The light emission dose was changed in two steps between 50 mj/cm$^2$ and 75 mj/cm$^2$. In addition, the number of rotations of the wafer during the light emission from the light source 42 (the number of rotations of the wafer during the emission of a predetermined amount of light) was changed in three steps of one rotation, three rotations, and five rotations. Further, the lamp correction value (current correction value) in the light sources 42 was changed in two steps of 2.5 and 3.5. Under the conditions in which these set values were changed, LWR was measured for each of the resist pattern 13 (ADI) and the pattern (AEI) in the underlying film when the underlying film was etched using the resist pattern 13 as a mask. The Ar flow rate during the light emission by the light sources 42 was 20 mL/sec.

FIG. 7 shows LWR measurement results. In FIG. 7, the measurement results when light (VUV light) was not emitted from the light sources 42 using the substrate processing apparatus 1 are indicated as reference values (Ref). Regarding the lamp correction value of 2.5, the measurement results are shown for the case in which the dose was 50 mj/cm$^2$ and the number of rotations was 1 and for the case in which the dose was 75 mj/cm$^2$ and the number of rotations was 1, 3, and 5. Regarding the lamp correction value of 3.5, the measurement results are shown for the case in which the dose was 50 mj/cm$^2$ and the number of rotations 1 and for the case in which the dose of 75 mj/cm$^2$ and the number of rotations was 1.

As shown in FIG. 7, it was confirmed that LWR of the underlying film pattern (AEI) was lower than that of the resist pattern 13 (ADI) at both doses of 50 mj/cm$^2$ and 75 mj/cm$^2$. Further, in the case in which the lamp correction value was 2.5 and the number of rotations was 1, LWR of the underlying film pattern (AEI) was lower when the dose is 75 mj/cm$^2$ than when the dose is 50 mj/cm$^2$. From this, it is estimated that when the dose was set to 75 mj/cm$^2$, the etching resistance in the resist pattern 13 was improved and the roughness of the surface in the underlying film pattern (AEI) was improved.

When the dose was 50 mj/cm$^2$, LWR measurement results of the underlying film pattern (AEI) changed between the lamp correction value of 2.5 and the lamp correction value of 3.5, and LWR was smaller when the lamp correction value was 3.5. In contrast, when the dose was 75 mj/cm$^2$, LWR measurement results of the underlying film pattern (AEI) were almost unchanged between the lamp correction value of 2.5 and the lamp correction value of 3.5. Further, when the lamp correction value was 3.5, there was almost no difference in LWR measurement results between the dose of 50 mj/cm$^2$ and the dose of 75 mj/cm$^2$. From this, it is estimated that when the dose was 50 mj/cm$^2$ and the lamp correction value was 2.5, since the breaking of chemical bonds and the cross-linking reaction by the light emitted from the light source 42 and including VUV light did not proceed sufficiently, LWR was not sufficiently improved (there is room for further improvement). On the other hand, it is estimated that when the dose was 50 mj/cm$^2$ and the lamp correction value was 3.5, and when the dose was 75 mj/cm$^2$, the breaking of chemical bonds and cross-linking reaction by the light including VUV light and emitted from the light sources 42 were sufficiently performed.

(Regarding Influence of Number of Rotations)

Next, three results, obtained when the number of rotations was changed to 1, 3, and 5 under the conditions in which the lamp correction value was 2.5 and the dose was 75 mj/cm$^2$, were compared, and LWR of the resist pattern 13 (ADI) was substantially the same in the three cases. In contrast, it is confirmed that LWR of the underlying film pattern (AEI) was more improved (LWR was smaller) when the number of rotations was small. As a result, it is conceivable that even when the resist pattern 13 is irradiated with the same dose of light (VUV light), the tendency of penetration into the resist pattern 13 changes depending on the number of rotations. Further, in the case of the resist pattern 13 described in this embodiment, it is considered that this suggests that the effect of improving LWR can be enhanced by decreasing the number of rotations. This point will be described with reference to FIGS. 8A to 8D.

Figure 8A:
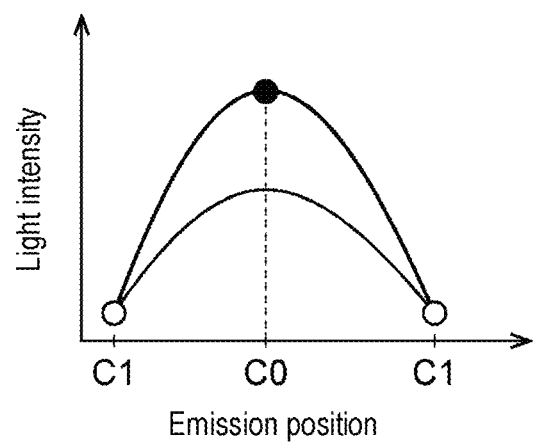
FIGS. 8A to 8D are views illustrating changes in intensity of light received by a rotating substrate.

FIGS. 8A to 8D are views for explaining a change in the intensity of light received by a specific position on a wafer W when the relative position of the light source 42 to that specific position changes caused by the rotation of the wafer W. FIG. 8A is a view illustrating the diffusion of light from a light source 42. The light emission position C0 illustrated in FIG. 8A is a position corresponding to (directly below) a point light source 44 in the light source 42, and the intensity of the light from the light source 42 is maximal at the position. On the other hand, the light intensity decreases as the distance from the light emission position C0 corresponding to the point light source 44 increases, and the light intensity becomes minimal at the light emission positions C1 at the ends. In this way, the light amount greatly changes depending on the positional relationship with the light source 42. Therefore, in the substrate processing apparatus 1, it is attempted to make the amount of light received at each position on the surface of the wafer W uniform to some extent by rotating the wafer W.

Figure 8B:
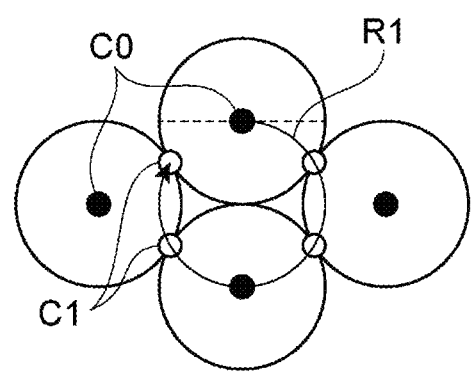
Figure 8C:
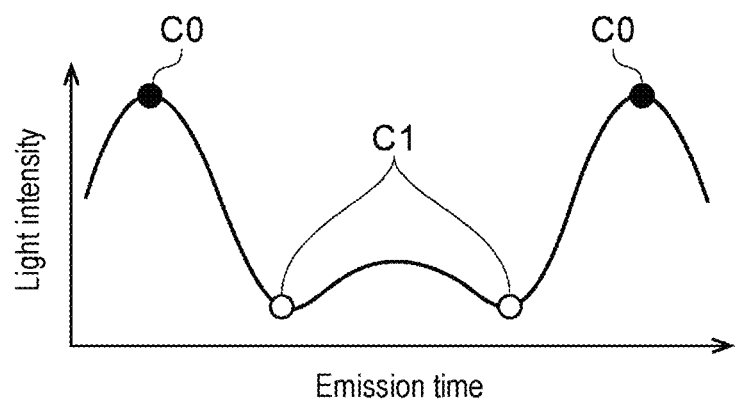
Figure 8D:
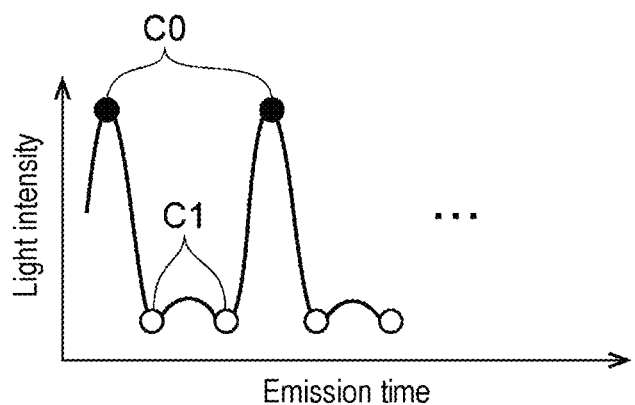

In FIG. 8B, the movement of a specific one point (here, referred to as a "specific point") of the wafer W with respect to the light source 42 when the wafer W is rotated is schematically indicated by the arrow RE FIG. 8B illustrates a state in which four light sources 42 are arranged at positions corresponding to the light emission positions C0. Further, it is assumed that, by rotating the wafer W, the specific point on the wafer W is rotated along the arrow RE In this case, the wafer W passes through two light emission positions C0 and four light emission positions C1. As described above, the light emission positions C0 are the positions at which the intensity of the light emitted from the light source 42 is maximal, while the light emission positions C1 are the positions at which the intensity of the light emitted from the light source 42 is minimal. That is, when the specific point on the wafer W moves (rotates) along the arrow R1, the intensity of light received by the specific point changes since the specific position passes through both the light emission position C0 and the light emission position C1. FIGS. 8C and 8D are views schematically showing changes in the intensity of light received by the specific point on the wafer W moved along the arrow RE In the example shown in FIG. 8D, the number of rotations is increased compared with the example shown in FIG. 8C. Even if the number of rotations is increased, the movement path of the specific point (corresponding to the arrow R1) does not change, and thus the specific point passes through both light emission positions C0 and C1. However, when the number of rotations is large, the speed of change of the intensity of light received by the specific point also increases.

In the state in which the intensity of light is high (for example, at the light emission positions C0 in FIGS. 8A to 8D), it becomes easy for both the VUV light of a high-intensity wavelength region and the VUV light of a low-intensity wavelength region in the light from the light source 42 to penetrate into the resist pattern 13. On the other hand, in the state in which the intensity of light is low (for example, at the light emission positions C1 in FIGS. 8A to 8D), although the VUV light of a high-intensity wavelength region in the light from the light source 42 penetrates into the resist pattern 13, it becomes difficult for the VUV of a low-intensity wavelength region to penetrate into the resist pattern 13. That is, it may be considered that, in the state in which the intensity of light is low, the light of a low-intensity wavelength region among the light of the components of respective wavelengths corresponding to the continuous spectrum of the VUV light, is not irradiated with a sufficient amount of light for facilitating the modification of the resist pattern 13.

In a resist material for EUV lithography used in this embodiment, it is considered that the resist material for EUV lithography is less likely to absorb the light including VUV light and emitted from the light sources 42 compared to a resist material used for other purposes, and thus the resist material for EUV lithography is poor in responsiveness to the light from the light sources 42. Therefore, it is considered that, when the rotation speed is increased, even if the light intensity is high, it is difficult for the VUV light of a low-intensity wavelength region to penetrate into the resist pattern 13. Therefore, as shown in FIG. 7, it is considered that, compared with the case in which the number of rotations is large, when the number of rotations is small, it is possible to increase the light penetration rate into the resist pattern 13, and thus it is possible to facilitate the breaking of chemical bonds and the cross-linking reaction in the resist pattern 13. The breaking of chemical bonds and the cross-linking reaction contribute to the improvement of etching resistance. In the results shown in FIG. 7, the resist pattern 13 (ADI) has almost the same LWR, but the underlying film pattern (AEI) has smaller LWR when the number of rotations is smaller than when the number of rotations is larger. Thus, it is confirmed that the surface roughness is improved. That is, it is considered that, since a result of the effect of improving the etching resistance of the resist pattern 13 is different depending on the number of rotations, LWR of the underlying film pattern (AEI) after the resist pattern 13 being used as a mask was changed. As described above, it is considered that the time for which the light irradiation continues is important when the resist pattern 13 of a resist material for EUV lithography is irradiated with the light emitted from the light source 42 including VUV light. That is, rather than increasing the number of rotations in consideration of the in-plane uniformity of light emission, it may be more important to maintain a large light intensity state (e.g., the time when passing through the light emission positions C0) for a longer continuous period of time so that the light sufficiently penetrates into the resist pattern 13 at each position. It is considered that the effect of improving the surface roughness of the underlying film pattern can be enhanced by realizing the state described above.

The specific number of rotations may be, for example, about 1 to 4 rotations of the wafer W while the wafer W is irradiated with a dose of light of 75 mj/cm$^2$. Since the time required for one process is 93.75 sec when the illuminance from the light sources 42 is set to 0.8 mW/cm$^2$, the above-mentioned range corresponds to setting the rotation of the holder 26 to about 0.5 rpm to 3 rpm.

The number of rotations of the wafer W does not have to be constant while the light from the light sources 42 is being emitted. As described above, when the number of rotations increases, the VUV light of a high-intensity wavelength region easily penetrates into the resist pattern 13. Therefore, by emitting the light from the light sources 42 to the wafer W while changing the number of rotations, the light emission from the light sources 42 may be adjusted such that the light of a specific wavelength region is more likely to penetrate into the wafer W.

(Regarding Illuminance Distribution Derived from Light Source Position)

When a circular substrate such as a wafer W is rotated at a certain angular velocity, the inner side (near the center) and the outer side (near the end) of the wafer W have different moving speeds with respect to the light sources 42 and different positional relationships with respect to the light sources 42. Specifically, when the distance from the center of rotation increases, the actual moving speed increases. Thus, the inner side of the wafer W has a low moving speed with respect to the light sources 42, and the outer side of the wafer W has a high moving speed with respect to the light sources 42. In addition, the light irradiation regions through which the wafer W pass during one rotation are significantly different at the inside and the outside of the wafer W, respectively. For example, when the light sources 42 are arranged as illustrated in FIG. 3, the inner side of the wafer W passes through the regions irradiated by four inner light sources 42 while the wafer W rotates once. On the other hand, the outer side of the wafer W passes through the regions irradiated by eight outer light sources 42 while the wafer W rotates once. Accordingly, the outer side of the wafer W passes through regions irradiated by more light sources 42, and thus more frequently passes through the regions in which the light intensity is high. Thus, even if the wafer W is rotated at a constant speed, the light (particularly, the speed of change in the intensity of emitted light) received by the resist pattern 13 on the surface of the wafer W varies depending on the position on the wafer W (in particular, the distance from the center of rotation). Accordingly, it is considered that the degree of improvement of the surface roughness of the resist pattern 13 may consequently vary depending on the position on the surface of the wafer W. Further, in the case of the arrangement illustrated in FIG. 3, the outer side of the wafer W repeatedly passes through the regions in which the intensity of light from the light sources 42 is high, and a time period for which the outer side of the wafer W passes through one of the regions having a low intensity of light is short. Therefore, since the wafer W is strongly influenced by the time period for which it passes through a region in which the intensity of light from the light sources 42 is high, the modification of the resist pattern 13 by light is facilitated.

Figure 9:
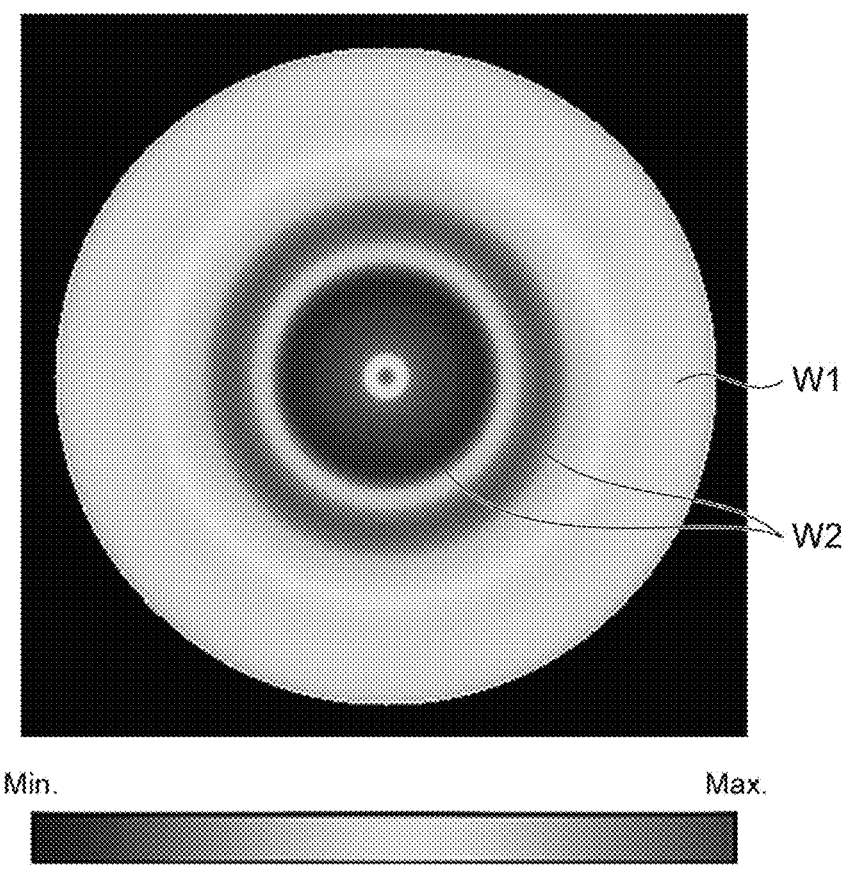
FIG. 9 is a view illustrating an illuminance distribution on a substrate.

FIG. 9 illustrates an exemplary illuminance distribution of light received at each position of the wafer W (the distribution of light irradiation amount) when the light is emitted from the plurality of light sources 42 while the wafer W is rotating. Here, the light sources 42 are arranged such that a plurality of light sources 42 are arranged inside and outside as shown in FIG. 3. In the example illustrated in FIG. 9, it is confirmed that the unevenness of illuminance of the light received by the surface of the wafer W occurs between the outer side and the inner side of the wafer W. Specifically, the illuminance of the received light is moderate in the outer region W1 of the wafer W, whereas the illuminance of the received light is low in the inner region W2 of the wafer W (the region W2 has the "Min." side color). Further, near the center, a region in which the illuminance changes depending on the distance from the center exists between the regions W1 and W2. One cause of such unevenness of the illuminance of light may be as follows: the moving speed of the wafer W with respect to the light sources 42 varies depending on the position on the wafer W, as described above. Further, it is considered that the fact that positions on the wafer W are different in how to pass through a region in which the intensity of light is high (e.g., at the light emission positions C0 in FIGS. 8A to 8D) and a region in which the intensity of light is low (e.g., the light emission positions C1 in FIGS. 8A to 8D) among the irradiation regions of respective light sources 42 is also a cause. It is considered that such unevenness of the illuminance distribution also affects the unevenness of the effect of improving the surface roughness of the resist pattern 13 and the underlying film pattern.

When the unevenness of the illuminance distribution occurs at each position on the surface of the wafer W (especially in the radial direction), as a method for suppressing the unevenness, changing the intensity of light emitted from the plurality of light sources 42 to the wafer W may be considered.

The specific method of changing the intensity of light emitted from the light source 42 to the wafer W according to the position on the wafer W (especially, at the inner side and outer side) is not particularly limited. For example, changing the arrangement of the light sources 42, the number of the light sources 42, and the intensity of light output from each light source 42 may be considered. For example, it is possible to make the intensity of the light output from the inner light sources 42 higher than the intensity of light from the outer light sources 42 by setting the current correction values of the four inner light sources to 3.5 and the current correction values of the eight outer light sources to 2.5 among the twelve light sources 42 illustrated in FIG. 3. Further, the unevenness of the illuminance distribution illustrated in FIG. 9 may be reduced by changing the arrangement of the light sources without changing, for example, the current correction values. As described above, the intensity of light output from each light source 42 greatly differs between the vicinity of the center (C0) and the vicinity of the edge (C1) even within the irradiation region. The degree of light reaching the deep layer in the resist pattern 13 when passing through the region and the degree of modification of the resist pattern 13 based on the received light greatly differ between the vicinity of the center (C0) and the vicinity of the edge (C1). In addition, by arranging adjacent light sources 42 such that the vicinities of the edges of the irradiation regions thereof overlap, it is possible to increase the amount of light received by the wafer W when passing through the overlapping regions. Accordingly, it is also possible to adjust the amount of light received by the resist pattern 13 by adjusting, for example, the size of the overlapping regions. In this way, by changing various configurations especially related to the light sources 42, it is possible to implement a configuration that makes the intensity of light emitted from the light sources 42 to the wafer W to be different depending on the position on the wafer W (especially at the inner side and outer side).

The "inner side" and the "outer side" of the wafer W indicate a relative positional relationship. Accordingly, the boundary between the inner side and the outer side is not particularly limited. Depending on the number of light sources 42 and the arrangement thereof, the place where the unevenness of the illuminance distribution in the radial direction of the wafer W occurs may change. However, since the light is emitted from the light sources 42 while the wafer W is rotating, the moving speed of the wafer W is small on the inner side and the moving speed of the wafer W is high on the outer side. Therefore, as a large tendency, the inner side of the wafer W is less likely to receive sufficient light for modifying the resist pattern 13 (breaking of chemical bonds and crosslinking reaction) compared to the outer side of the wafer W. In consideration of this point, a configuration in which the intensity of light emitted from the light sources 42 to the wafer W is different between the inner side and the outer side of the wafer W may be possible.

(Regarding Effect of Additive on Resist Material for EUV Lithography)

In Evaluation Test 1 described above, for the resist pattern 13, a resist material in which polymethylmethacrylate resin (PMMA) is selected as a resin material and a photolytic quencher is added as an additive is used. However, in EUV lithography, the added amount of the additive also greatly affects the optical characteristics of the resist, and thus the added amount of the additive may change. Therefore, the results of studying the change in the optical characteristics of the resist pattern 13 caused by changing the added amount of the additive (in particular, the change when the light including VUV light is emitted from the light sources 42) are shown. In the following evaluation test, the same resin material as the resist material used in Evaluation Test 1 described was used, and the same type of photolytic quencher was selected as an additive.

(Evaluation Test 2 and Result)

Using the same resin material as the resist material used in Evaluation Test 1, three types of resist materials were prepared in which the same type of photolytic quencher was added as an additive. However, the added amount of the additive differs among the three types. Here, three types of resist materials are referred to as Resist A, Resist B, and Resist C.

Among the three types of resist materials, Resist A was the same as the resist material used in Evaluation Test 1. In addition, Resists B and C were obtained by increasing the added amount of the photolytic quencher (the added amount per unit weight of the resist material) compared with Resist A. In addition, the added amounts of the photolytic quencher had a relationship of A<B<C.

Each of resist patterns 13 made of the above three types of resist materials was formed on an SOC film 11 and an SOG film 12, and three types of test wafers were prepared. The pattern sizes of the resist materials were different from each other. Resist A had a thickness of 20 nm, Resist B had a thickness of 19 nm, and Resist C had a thickness of 22 nm. It has been generally known that a resist material having a larger pattern size has a smaller LWR associated with surface roughness.

Figure 10:
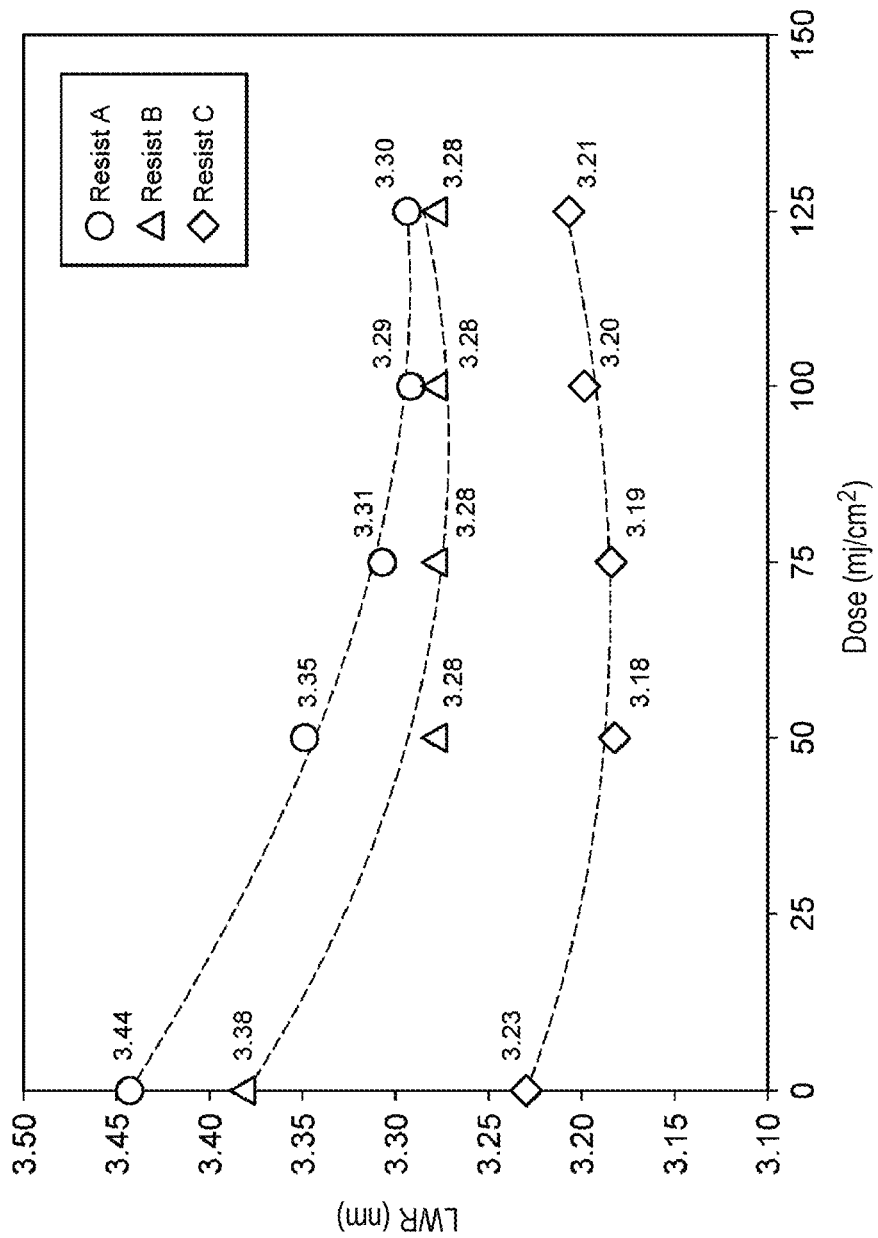
FIG. 10 is a view illustrating a result of Evaluation Test 2.

In the substrate processing apparatus 1, each test wafer was irradiated with a predetermined dose of light from the light sources 42, and then LWR was measured. The results are shown in FIG. 10. The horizontal axis of FIG. 10 represents the dose of light (including VUV light) emitted from the light sources 42. The dose of 0 mj/cm$^2$ indicates that the resist pattern 13 is not irradiated with light from the light sources 42.

As shown in FIG. 10, it was confirmed that LWR becomes smaller in the order of Resist A, Resist B, and Resist C, regardless of the presence or absence of light emission from the light sources 42. Further, for Resist A, LWR became approximately minimal when the dose of light from the light source 42 was increased to about 100 mj/cm$^2$, but for Resist B and Resist C, LWR became almost minimal when the dose of light from the light sources 42 was set to about 50 to about 75 mj/cm$^2$. Thus, it was confirmed that, even when the same type of additive was added, the characteristics of resists with respect to the light emitted from the light sources 42 and including VUV light changed depending on the added amount.

(Evaluation Test 3 and Result)

Two types of test wafers were prepared by applying each of Resist A and Resist B to an SOC film 11 and an SOG film 12 on each of the test wafers in a flat film form, and the resist film thicknesses were measured. Then, in the substrate processing apparatus 1, each test wafer was irradiated with a predetermined dose of light from the light sources 42, and then the resist film thickness was measured so as to measure the change in the resist film thickness caused by being irradiated with light. Further, each resist after being irradiated with light was etched under predetermined conditions, and the amount of change in film thickness due to etching was measured. On the other hand, as a comparison target, a test wafer similar to those described above was prepared, and the amount of change in film thickness due to etching was measured when etching was performed under the same conditions without light emission from the light sources 42.

Figure 11:
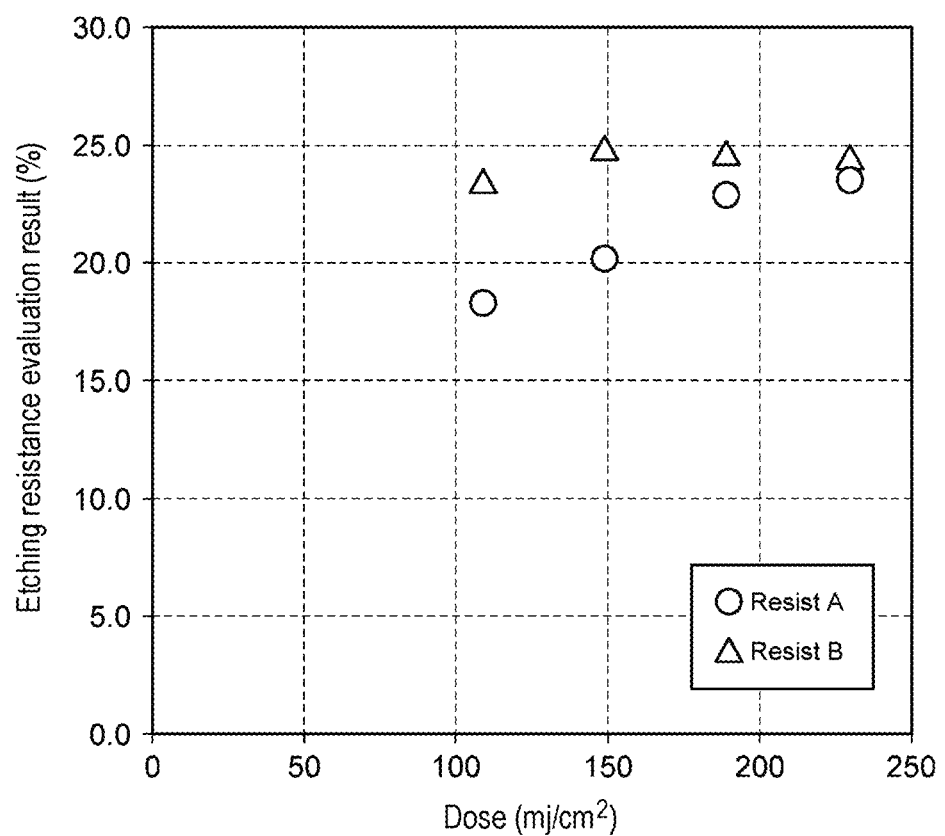
FIG. 11 is a view illustrating a result of Evaluation Test 3.

From the above measurement results, it is possible to understand the difference in etching depth when etching was performed under the same conditions depending on the presence or absence of light emission from the light sources 42. Therefore, it is possible to determine how much the etching resistance is improved by the light emission from the light sources 42. Further, the resist film thickness is changed (the film thickness is reduced) by the modification of the resist material (breaking of chemical bonds and crosslinking reaction) by light emission from the light sources 42. Based on this change amount, FIG. 11 shows the results of evaluating how the etching resistance was changed by the light emission from the light sources 42. The horizontal axis of FIG. 11 represents the dose of light (including VUV light) emitted from the light sources 42. The vertical axis represents the degree of improvement in etching resistance. In order to confirm the change in the surface layer of the resist material depending on the presence or absence of light emission, evaluation was performed with a short etching time, for example, 5 sec or less.

As shown in FIG. 11, it was confirmed that Resist A was improved in etching resistance as the emission amount (dose) of light from the light sources 42 was increased from 100 mj/cm$^2$ to 200 mj/cm$^2$ or more. On the other hand, it was confirmed that Resist B was improved in etching resistance to some extent even when the dose of light from the light sources 42 was small (100 mj/cm$^2$), and did not change much in etching resistance even when the dose was increased. As described above, it is considered that the degree of improvement in etching resistance of resist B changed as shown in FIG. 11 since the amount of the photolytic quencher added to Resist B was larger than that added to Resist A. As described above, it may be considered that a resist material for EUV lithography may experience changes in the characteristics of a resist pattern when irradiated with light including VUV light and a possibility of changes in tendency thereof, depending on the type or amount of the additive.

(Difference in Improvement Tendency of Surface Roughness Depending on Addition Amount of Additive)
(Evaluation Test 4)

Figure 12:
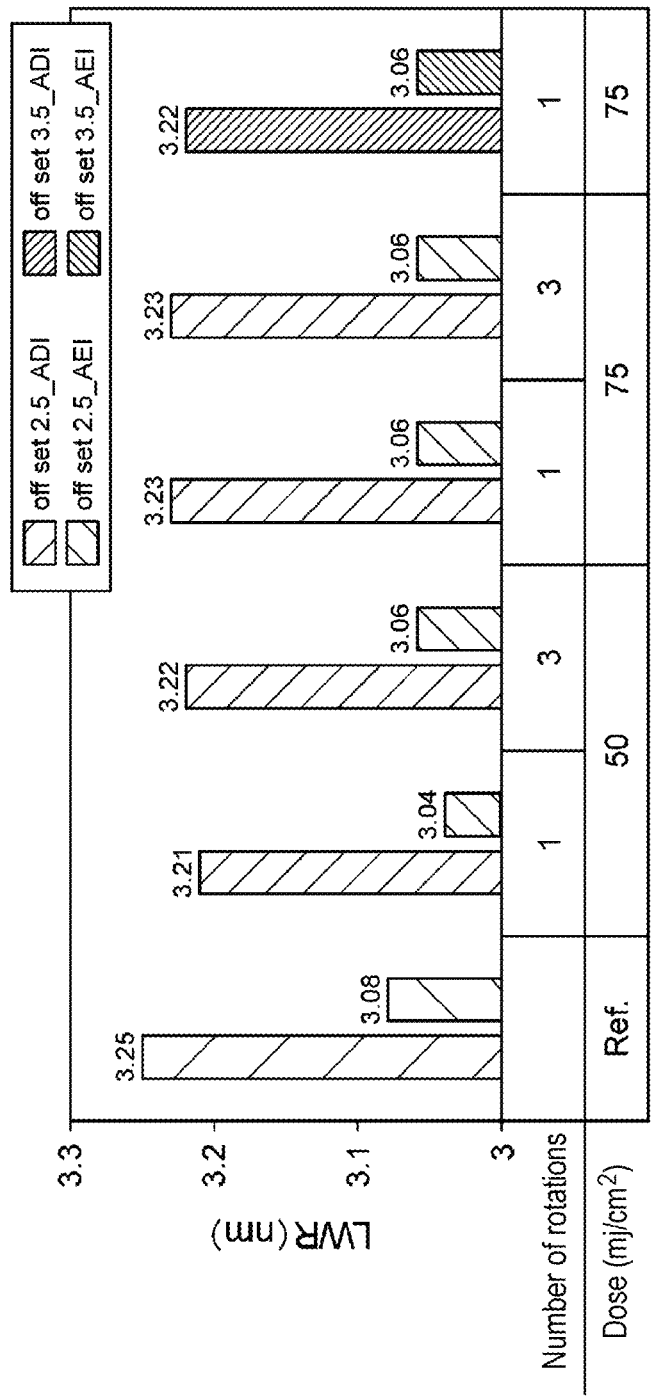
FIG. 12 is a view illustrating a result of Evaluation Test 4.

As Evaluation Test 4, with respect to Resist C, as in the case of Resist A, the improvement of surface roughness when various conditions relating to light emission were changed was evaluated. FIG. 12 is a view showing the results of Evaluation Test 4.

Specifically, a change in LWR (line width roughness) was evaluated when the number of rotations of the wafer was changed to two conditions and the lamp current correction value during light emission from the light sources 42 was changed to two conditions. The evaluation targets are a resist pattern 13 and a pattern in an underlying film when the underlying film was etched using the resist pattern 13 as a mask. The structure of the used wafer W is the same as that of Resist A described with reference to FIG. 7. The used resist material was Resist C, and the added amount of photolytic quencher was larger than that in Resist A.

The wafer W having the resist pattern 13 formed on the surface thereof was stored in the housing 21 of the substrate processing apparatus 1, and the pressure inside the housing 21 was reduced. When the inside of the housing 21 reached the set pressure, light was emitted from the light sources 42. A series of operations is the same as the above substrate processing method. The light emission dose was changed in two steps between 50 mj/cm$^2$ and 75 mj/cm$^2$. In addition, the number of rotations of the wafer during the light emission from the light source 42 (the number of rotations of the wafer during the emission of a predetermined amount of light) was changed in two steps of one rotation and three rotations. Further, the lamp correction value (current correction value) in the light sources 42 was changed in two steps of 2.5 and 3.5. Under the conditions in which these set values were changed, LWR was measured for each of the resist pattern 13 (ADI) and the pattern (AEI) in the underlying film when the underlying film was etched using the resist pattern 13 as a mask. The Ar flow rate during the light emission by the light sources 42 was 20 mL/sec.

FIG. 12 shows LWR measurement results. In FIG. 12, the measurement results of the case where emission of light (VUV light) from the light sources 42 using the substrate processing apparatus 1 was not performed are indicated as reference values (Ref). Regarding the lamp correction value of 2.5, the measurement results are shown for the case in which the dose was 50 mj/cm$^2$ and the number of rotations was 1 and 3, and for the case in which the dose was 75 mj/cm$^2$ and the number of rotations was 1 and 3. Further, in the case of the lamp correction value 3.5, the measurement results are shown for the case in which the dose was 75 mj/cm$^2$ and the number of rotations is 1.

In the results shown in FIG. 12, it was confirmed that LWR of the underlying film pattern (AEI) was lower than that of the resist pattern 13 (ADI) at both doses of 50 mj/cm$^2$ and 75 mj/cm$^2$. In addition, LWRs are substantially the same for both the lamp correction value 2.5 and the lamp correction value 3.5. From this, it is estimated that under either condition, the etching resistance in the resist pattern 13 was improved and the roughness of the surface in the underlying film pattern (AEI) was improved. From the results shown in FIG. 11, it is estimated that the responsiveness of the resist material to the light from the light sources 42 is increased when the added amount of the photolytic quencher is increased. The results shown in FIG. 12 are consistent with the estimation based on the results shown in FIG. 11.

Upon comparing the two results, obtained when the number of rotations was changed to 1 and 3 under the conditions in which the lamp correction value was 2.5 and the dose was 50 mj/cm$^2$, it was confirmed that LWR of the resist pattern 13 (ADI) was substantially the same at the two cases. On the other hand, it was confirmed that LWR of the underlying film pattern (AEI) was slightly smaller when the number of rotations was 1. This tendency is the same as in Evaluation Test 1 (Resist A). As described above, the characteristics of a resist material may change depending on the added amount of an additive. However, in the results of Evaluation Test 4, since Resist A and Resist C showed similar tendencies, it is estimated that an ordinary resist material for EUV lithography tends to exhibit the same tendency. That is, although it is known that the surface roughness of the resist material tends to be improved by adding an additive, when VUV light is emitted, the improvement effect can be further enhanced regardless of the amount of the additive.

[Action]

As described above, in the substrate processing apparatus 1 and the substrate processing method described above, the number of rotations of the substrate when the light sources 42 irradiate the substrate with light is set to 0.5 rpm to 3 rpm. With such a configuration, the vacuum ultraviolet light, particularly, having the low wavelength, also easily penetrates into the pattern, and may thus enhance the effect of improving the surface roughness. As described above, since the pattern made of the resist material for EUV lithography has low responsiveness to light, it is required to emit the vacuum ultraviolet light over a certain period of time. In contrast, with the above-described configuration, even the light, particularly, having the low wavelength, which has a low light intensity, easily penetrates into the pattern, and may thus enhance the effect of improving the surface roughness.

In addition, the number of rotations of the substrate may be changed during the light emission from the light sources 42. A component of light that penetrates into the pattern may be changed depending on the number of rotations of the substrate during the emission of light. Therefore, by adopting a configuration in which light is emitted while changing the number of rotations, it is possible to cause a light component suitable for improving surface roughness to penetrate into the pattern. Thus, it is possible to further enhance the effect of improving surface roughness. A configuration in which the number of rotations of the substrate is further changed during the light emission from the light source 42 by allowing the substrate to be a stopped state, that is, the state in which the rotation of the substrate is temporarily stopped may be possible. Even with such a configuration, the component of light that penetrates into the pattern can be changed. Thus, it is possible to further enhance the effect of improving the surface roughness. The time and the like at the time of temporary stopping may be appropriately adjusted depending on, for example, the pattern.

In addition, a gas supply part 30 configured to supply an inert gas into the processing container and a gas discharge part 35 configured to discharge the gas from the processing container are provided. At this time, the gas supply part 30 and the gas discharge part 35 may be configured to supply and discharge the gas while changing the pressure inside the processing container while the light source emits light. With such a configuration, it is possible to irradiate the pattern with vacuum ultraviolet light while keeping the pressure in the processing container in a state according to the surface condition of the substrate.

For example, the arrangement and number of the light sources 42 in the substrate processing apparatus 1 can be changed appropriately. In addition, for example, a member for controlling the path of light emitted from the light sources 42 may be added. Further, the arrangement and configuration of each part in the substrate processing apparatus 1 may be changed appropriately. Further, the pressure control or the like described in the above-described embodiments is an example, and the control of the pressure inside the housing 21 may be changed including the stage before the light emission from the light sources 42.

According to the present disclosure, it is possible to provide a technique capable of improving surface roughness in a substrate using a resist material suitable for EUV lithography.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a holder configured to hold, within a processing container, a substrate having a pattern formed of a resist material for EUV lithography on a surface of the substrate;
a rotation driving part configured to rotate the holder;
a light source part including a light source configured to emit light to the surface of the substrate held by the holder that is rotated by the rotation driving part; and
a controller configured to control the rotation driving part to change a number of rotations of the substrate while the light source emits the light, based on a light penetration rate of light of a specific wavelength of the emitted light into the pattern on the surface of the substrate,
wherein the light emitted from the light source forms a continuous spectrum that includes light having a wavelength longer than 160 nm and light having a wavelength shorter than 160 nm, in a range of 10 nm to 200 nm.

2. The substrate processing apparatus of claim 1, wherein the number of rotations of the substrate is changed while the light source part emits light.

3. The substrate processing apparatus of claim 2, wherein the rotation of the substrate is temporarily stopped while the light source part emits light.

4. The substrate processing apparatus of claim 1, wherein the rotation of the substrate is temporarily stopped while the light source part emits light.

5. The substrate processing apparatus of claim 1, further comprising:
a gas supply part configured to supply an inert gas into the processing container; and a gas discharge part configured to discharge the inert gas from the processing container,
wherein the gas supply part and the gas discharge part perform supply and discharge of the inert gas while changing a pressure in the processing container while the light source part emits light.

6. A substrate processing method comprising:
emitting light including vacuum ultraviolet light from a light source part including a light source to a surface of a substrate on which a pattern is formed of a resist material for EUV lithography in a processing container while rotating the substrate; and
controlling a rotation driving part to change a number of rotations of the substrate based on a light penetration rate of light of a specific wavelength of the emitted light into the pattern on the surface of the substrate,
wherein the light emitted from the light source forms a continuous spectrum that includes light having a wavelength longer than 160 nm and light having a wavelength shorter than 160 nm, in a range of 10 nm to 200 nm.

7. A non-transitory computer-readable storage medium storing a program that causes a substrate processing apparatus to execute the substrate processing method of claim 6.

8. The substrate processing apparatus of claim 1,
wherein the controller is further configured to control the rotation driving part to change the number of rotations of the substrate so as to increase the light penetration rate of the light of the specific wavelength into the pattern on the surface of the substrate.

9. The substrate processing apparatus of claim 1, wherein the rotation driving part is further configured to rotate the holder such that the number of rotations of the substrate is 0.5 rpm to 3 rpm.

10. The substrate processing method of claim 6, wherein controlling the rotation driving part includes:
   controlling the rotation driving part to change the number of rotations of the substrate so as to increase the light penetration rate of the light of the specific wavelength into the pattern on the surface of the substrate.

11. The substrate processing method of claim 6, wherein the substrate is rotated such that the number of rotations of the substrate is 0.5 rpm to 3 rpm while the light is emitted to the surface of the substrate in the processing container.

* * * * *